United States Patent [19]

Sarma et al.

[11] Patent Number: 5,032,421

[45] Date of Patent: Jul. 16, 1991

[54] METAL COATING METHOD

[75] Inventors: Srinivasan V. Sarma, Hummelstown, Pa.; Walajabad S. Sampath, Fort Collins, Colo.; Nagarajan Subramanian, Fort Collins, Colo.; Paul J. Wilbur, Fort Collins, Colo.

[73] Assignee: AMP Incorporated, Harrisburg, Pa.

[21] Appl. No.: 570,481

[22] Filed: Aug. 21, 1990

[51] Int. Cl.⁵ .................................................. B05D 3/06
[52] U.S. Cl. ........................................ 427/38; 427/39;
427/42; 427/124; 427/125; 427/251; 427/255.5;
427/255.7; 427/261; 427/287; 427/290;
427/295; 427/319; 427/321; 427/327
[58] Field of Search ............... 427/38, 39, 124, 42,
427/125, 251, 255.5, 255.7, 261, 287, 290, 295,
319, 321, 327

[56] References Cited

U.S. PATENT DOCUMENTS

| 2,793,609 | 1/1954 | Shen et al. | 118/49 |
| 3,562,141 | 2/1968 | Morley | 204/298 |
| 3,625,848 | 12/1968 | Snaper | 204/192 |

Primary Examiner—Bernard Pianalto
Attorney, Agent, or Firm—Katherine A. Nelson

[57] ABSTRACT

This invention includes a method featuring steps having a transport (64, 68) to carry metal articles (10, 14) through a vacuum chamber (62, 66, 90) containing a plasma cleaning station (32) followed by exposure to an evaporant of metal (42) generated by an E-Beam (50) caused to condense on the articles in high vacuum. A channel structure (51) is provided to cause selective condensation upon the surface of said articles. The apparatus includes several stations (101, 102, 103) to provide multiple coatings on one or both sides of an article to be coated.

10 Claims, 3 Drawing Sheets

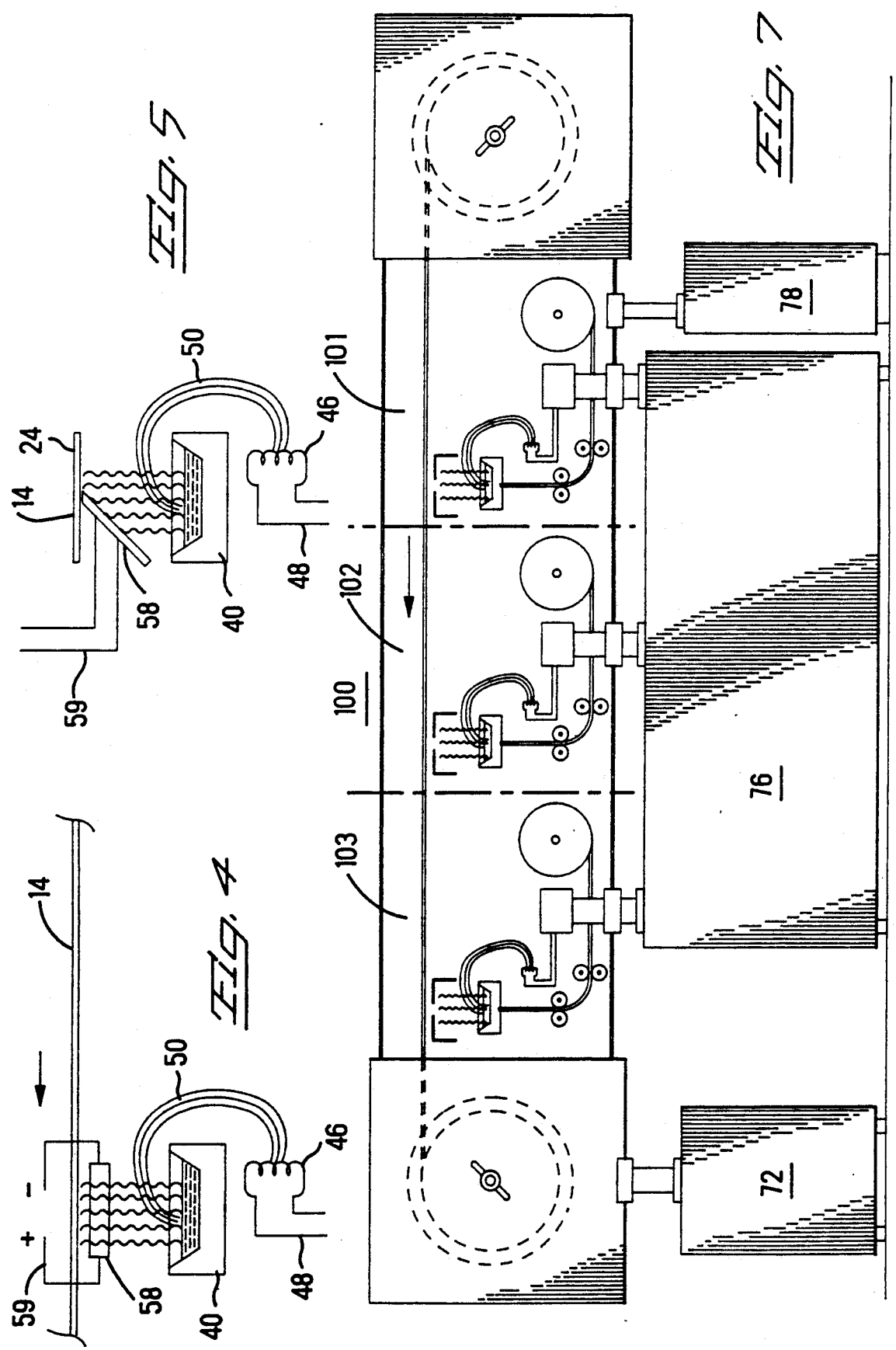

METAL COATING METHOD

This invention relates to a method and an apparatus for practicing such method that coats metal articles such as electrical contacts and terminals with a variety of metals by vacuum deposition using electron beam evaporation.

BACKGROUND OF THE INVENTION

Electrical terminals and connectors are typically made of high conductivity metals such as copper or a variety of alloys thereof including brass, phosphor bronze, beryllium copper and the like. For most low voltage applications and certain high voltage applications it is necessary to protect the surfaces of such articles by providing a film, coating or plating deposited on the surfaces thereof to minimize the buildup in time of unwanted oxides which may interfere with electrical interface. The most common practice is to utilize commercial and proprietary plating solutions of copper, nickel, zinc, tin, gold and in some cases tin lead alloys. Typically, the process involves dissolving the chosen metal to be plated into solution through the use of an anode, cathode, electrolyte and currents and voltages to effect electro deposition. Plating by electro deposition involves numerous steps of mechanical polishing, cleaning, buffing, degreasing, descaling, and a variety of electrolytic and chemical polishing steps. Following plating various steps of rinsing and further cleaning are necessary with substantial quantities of water, heat for the baths and plating stations and a variety of additive chemicals which effect efficiency of the plating process and help characterize the micro structure of the plating itself. The typical plating plant is quite large in terms of use of volume and quite costly in terms of equipment required. It is not unknown for the pollution equipment associated with plating plants to equal or exceed the amount of space required and the cost of the actual plating equipment.

Other techniques for coating have evolved including the process of sputtering, a process which is required to be done at modest vacuum but which because of the nature of the process produces relatively slow rates of deposition and the energy required in the sputtering process is very high.

With respect to the kinds of coatings required by electrical contacts most deposits vary in accordance with the design life, environment expected, number of cycles of engagement in use, and a variety of other such factors. Depositions on the order of a few millionths of an inch of gold are used for cosmetic purposes with actual contact surfaces ranging from 15 to 80 millionth of an inch and occasionally 100 or 125 millionth of an inch for certain critical specifications. Depositions of nickel, typically as barrier coatings beneath gold finishes and/or tin finishes range in coating thickness on the order of 100 millionths of an inch. Tin platings, and tin lead platings and various alloys thereof which are utilized most often relative to solder operations for terminals, are typically on the order of 240 millionths of an inch in thickness.

With respect to electrical terminals and connectors, the volumes requiring coating can for given installation number in the hundreds of thousands or millions per plant site per shift. This requirement means that whatever facility or processes used must be capable of high volume production of relatively tightly toleranced plating thicknesses.

Accordingly, it is an object of the invention to provide a method and apparatus for practicing such method that achieves a coating in the form of a variety of metal finishes needed for metal articles such as electrical terminals and connectors that can be operated at relatively high speeds to relatively tight tolerances and which in terms of space and cost represents a substantial improvement over existing electroplating practices. It is a further object to provide a novel dry plating method and apparatus having fewer steps than with other known practices of deposition and which may be practiced in a relatively small space essentially without the need for vast volumes of water and attendant pollution control equipment. It is yet a further object of the invention to provide a novel and effective coating as a finish for metal articles in the form of narrow strips including particularly electrical terminals and connectors yielding a novel microstructure having appropriate hardness and yet ductility when compared with other techniques of deposition.

BRIEF SUMMARY OF THE INVENTION

The foregoing objects of the invention are achieved by a method which embraces a series of steps of transport, cleaning, heating, and deposition by evaporation of a metal to be deposited that is condensed onto a target portion of a metal article such as an electrical terminal or connector through the use of an electron beam (E-beam) magnetically focused onto the material to be evaporated. In accordance with the preferred embodiment of the invention articles to be coated are supplied from a supply reel through a process area to a receiving reel with both reels and the article to be coated, as well as the area of process steps held under high vacuum. The article to be coated can be cleaned of unwanted surface scaling oxides and other materials by abrasion and then further cleaned of films, hydrocarbons and the like by exposure to the plasma of a glow discharge ring maintained at high voltage to create such plasma. In most cases, cleaning by glow discharge plasma will be sufficient. The article is next preheated and then fed into the proximity of a source of metal to be coated which is directly evaporated by the use of an E-Beam gun magnetically focused onto such material as held in a crucible. The E-Beam of the gun is in a preferred embodiment caused to be rastered or scanned over the material to facilitate a controlled evaporation without blow off of the material. In a preferred embodiment a variety of heated baffles are utilized to channel the evaporant onto desired areas of an article to be coated. The invention contemplates a series of E-Beams providing a series of evaporants of different metals such as those of nickel, tin or tin lead, and gold as required by a given product done sequentially in the apparatus. The invention contemplates the use of different delivery modes for the metal to be coated such as powder, pellet or rod form to charge and feed the appropriate crucible for the appropriate coating process.

BRIEF DESCRIPTION OF THE DRAWINGS

FIG. 4 is a schematic view of an alternative embodiment of the channeling concept of the invention.

FIG. 5 is an end view of the apparatus of FIG. 4.

FIG. 7 is a schematic view of an alternate embodiment for multiple coating of an article.

DESCRIPTION OF THE INVENTION

Figure 1:
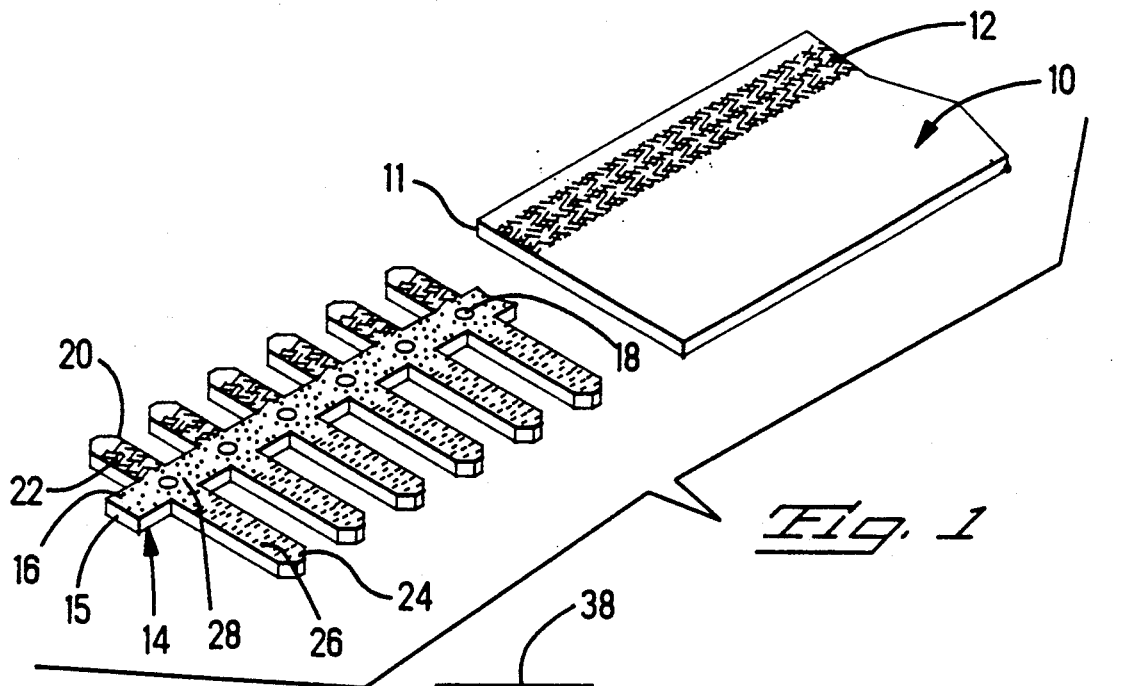
FIG. 1 is a perspective showing two representative forms of articles to be coated.

Referring now to FIG. 1, two forms of metallic articles 10 and 14 are shown. The article 10 represents a strip of metal 11 and includes a coating 12 on a portion of the upper surface thereof. The strip 11 may be taken to represent precoated stock which will subsequently be stamped and formed to define an electrical terminal or connector, the coating 12 serving as the contact interface. In practice, the strips 11 and 14, of which FIG. 1 represents a short segment, would be many hundreds of feet in length so as to facilitate a progressive and high speed processing both of the strip itself and of the application of the coating 12.

The article 14 represents an alternative geometry of electrical terminal stamped and formed prior to coating of a stock shown as 15 to include a centrally disposed carrier 16 punched out to define pilot holes 18 utilized to facilitate precise movement of the article. On one end are provided a series of rectangularly shaped posts 20 covered over with an outside finish 22 of a precious metal such as gold. The opposite end 24 has an outside finish through a coating of tin 26 with there being provided an undercoating of nickel 28, which extends beneath both the gold and the tin coatings In general practice the nickel serves as a barrier against the migration of unwanted constituents of the base metals and as well to prevent whiskering of the tin coating due to stresses in the metal or a base material. Preferentially, a tin lead coating may be employed. In practice, the posts would be sheared off from carrier 16 to be utilized with the end 24 inserted in a printed circuit or multilayered board and soldered thereto and the upper end 20 being employed for contact of mating connectors, wires, clips or the like. The articles of FIG. 1 are representative of a wide variety of shapes and geometries utilized for electrical terminals and connectors and requiring surface finishes such as gold palladium, platinum, silver, ruthenium, and various alloys as well as nickel coatings, tin, tin lead, and a variety of other alloys which facilitate solderability. With respect to the article 10 when utilized for geometries subsequently stamped and formed, the coating 12 may need to have considerable ductility to facilitate forming without cracking With respect to the article 14 the coatings must have their own individual characteristics ranging from a lack of porosity for the gold finish 22 to a certain hardness for intermating with other connectors. The articles 10 and 14 as shown are widely produced by electro deposit through plating lines capable of operating at many feet per minute on a continuous round the clock basis. It is with respect to structures like those shown in FIG. 1 that the present invention method and apparatus is directed; the object being to provide comparable or better finishes through a dry process.

Figure 2:
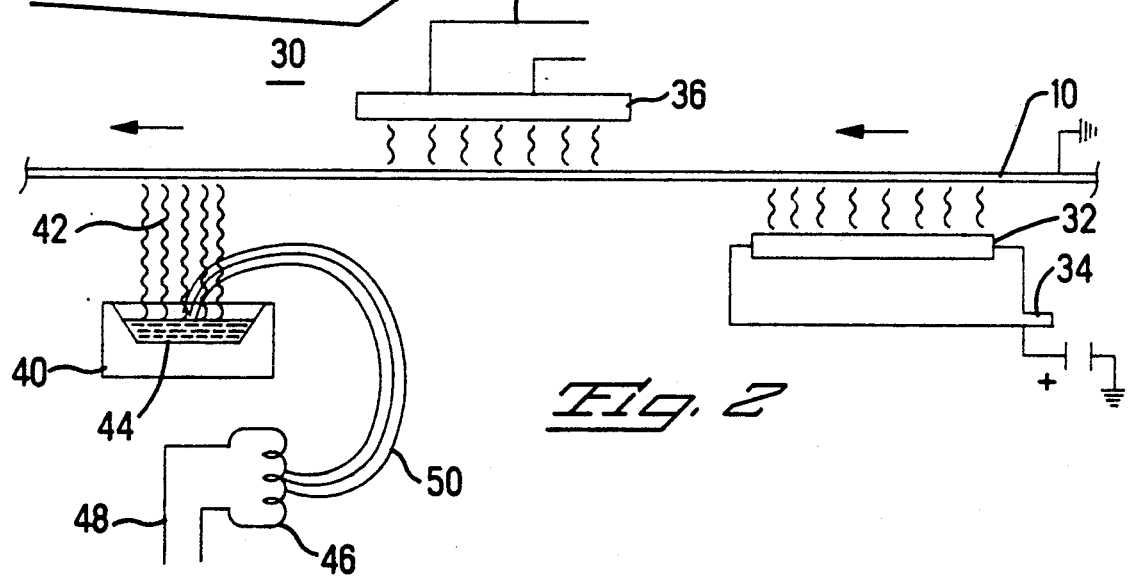
FIG. 2 is a schematic and elevational view of critical steps of the method of the invention illustrating a portion of the apparatus for such method.

This process is in part shown through the apparatus of FIG. 2. There a strip 10 is transported through a series of processing steps. Preparatory to the steps there shown, the strip 10 can be cleaned as by abrasion in apparatus not shown, the preferred abrasion being similar to sand blasting by utilizing small particles driven against the surface of 10 to remove scales, particulate matter and the like with the strip thereafter being air cleaned then rolled into reels of a suitable length to be handled in the manner hereinafter described. The clean strip 10 is then transported past a first station including a glow discharge ring 32 in the presence of argon gas, the ring being excited by a power supply connected to leads 34. This power supply is of a high enough voltage to develop a plasma which envelops the strip 10 spaced on the order of two inches from the ring so as to be well within the plasma. Other spacing may be needed depending upon material condition. The plasma of the ring is made to cover an appreciable length of the strip 10, typically twelve inches. The surface or surfaces of strip 10 are exposed to the plasma sufficiently to remove further surface contaminants, oxides, hydrocarbons and the like. Immediately following the cleaning step performed by the glow discharge ring 32 the strip is transported past a preheater 36 supplied by leads 38 intended to preheat the strip 10 through radiation to a temperature above 230 degrees Celsius. Immediately thereafter the strip is passed over a crucible 40 containing metal to be coated. The crucible is spaced a short distance from the strip and beneath the strip, between roughly two to seven inches from the undersurface of strip 10. An E-Beam emitter 46 is supplied by a power supply 48 to direct an electron beam 50 into the metal 44 causing such metal to evaporate and imparting such energy to the metal so that the metal evaporant strikes the undersurface of 10 and coats such surface. The beam 50 is deflected by a magnetic field supplied to the gun and focused on the metal material powder 44. In accordance with a preferred embodiment of the invention the beam 50 is caused to be scanned or rastered to improve the control of heating and preclude spattering of the metal particles and/or the evaporant. The E-Beam evaporation is practiced in a high vacuum in order to provide an essentially collisionless path of the evaporant as excited by the beam 50 to the surface of 10 sought to be coated. In FIG. 2 the E-Beam emitter 46 is shown to one side of the target crucible. It may be preferable to place the emitter beneath the crucible or elsewhere with focus provided magnetically to scan the material 44.

The velocity of transport of strip 10 is controlled to provide a control of the thickness of the coating applied thereto in conjunction with the strength of beam 50 and the particular coating material being employed.

Figure 3:
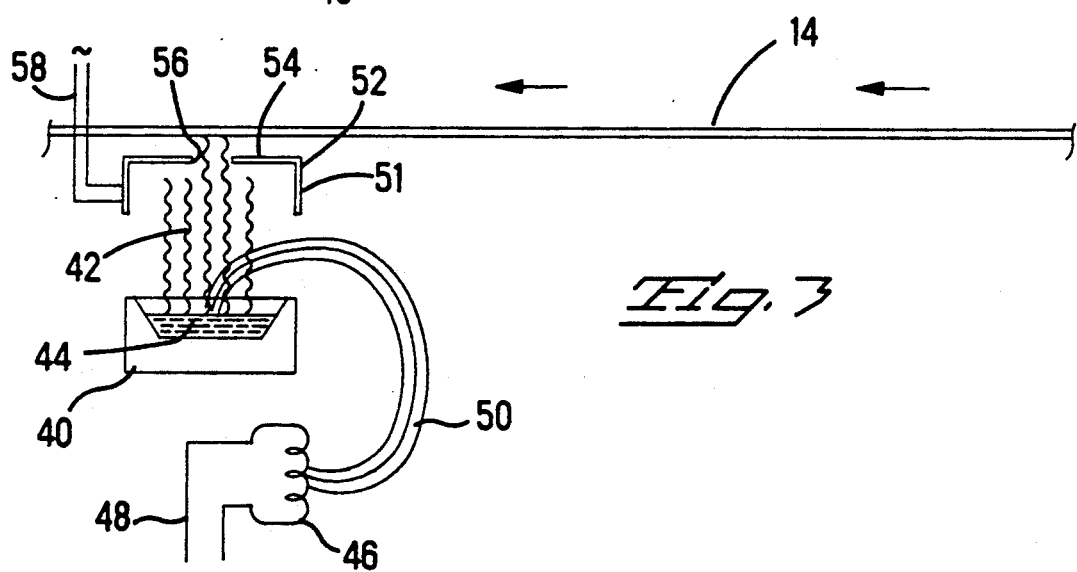
FIG. 3 is a schematic and elevational view detailing a channeling structure of the invention, method and apparatus.

FIG. 3 shows an alternative embodiment of the method of the invention including parts of the apparatus wherein a strip 14 is transported as in FIG. 2 with the appropriate cleaning and preheating steps not shown. In accordance with the embodiment of FIG. 3 there is additionally included an evaporant channeling structure 51. The structure 51 includes sidewalls 52, top surface 54 and an opening 56 through which the evaporant can pass. The structure is powered by leads 58 to be heated in order to avoid deposition and condensation on structure 51. Structure 51 is in one embodiment comprised of thin wall tungsten material fabricated into a suitable shape to cover over crucible 40 and reduce migration of the evaporant to either other parts of the strip 14 or elsewhere within the apparatus.

FIGS. 4 and 5 show a further alternative embodiment wherein a strip 14 is made to pass over a crucible 40 with a channeling structure 58 shown in the form of a baffle intended to reduce the condensation of evaporant onto portions of the strip other than that desired. For example, with respect to FIG. 1 the post portion 24 of strip 14 may be coated with tin or tin lead, it being important to preclude such coating from extending onto the post portion 20 of the strip. Baffle 58 is placed at an angle with one end proximate the edge of coatings 26 and the other end extended downwardly over the crucible. Baffle 58 may be suitably powered by leads shown as 59 to be heated.

Figure 6:
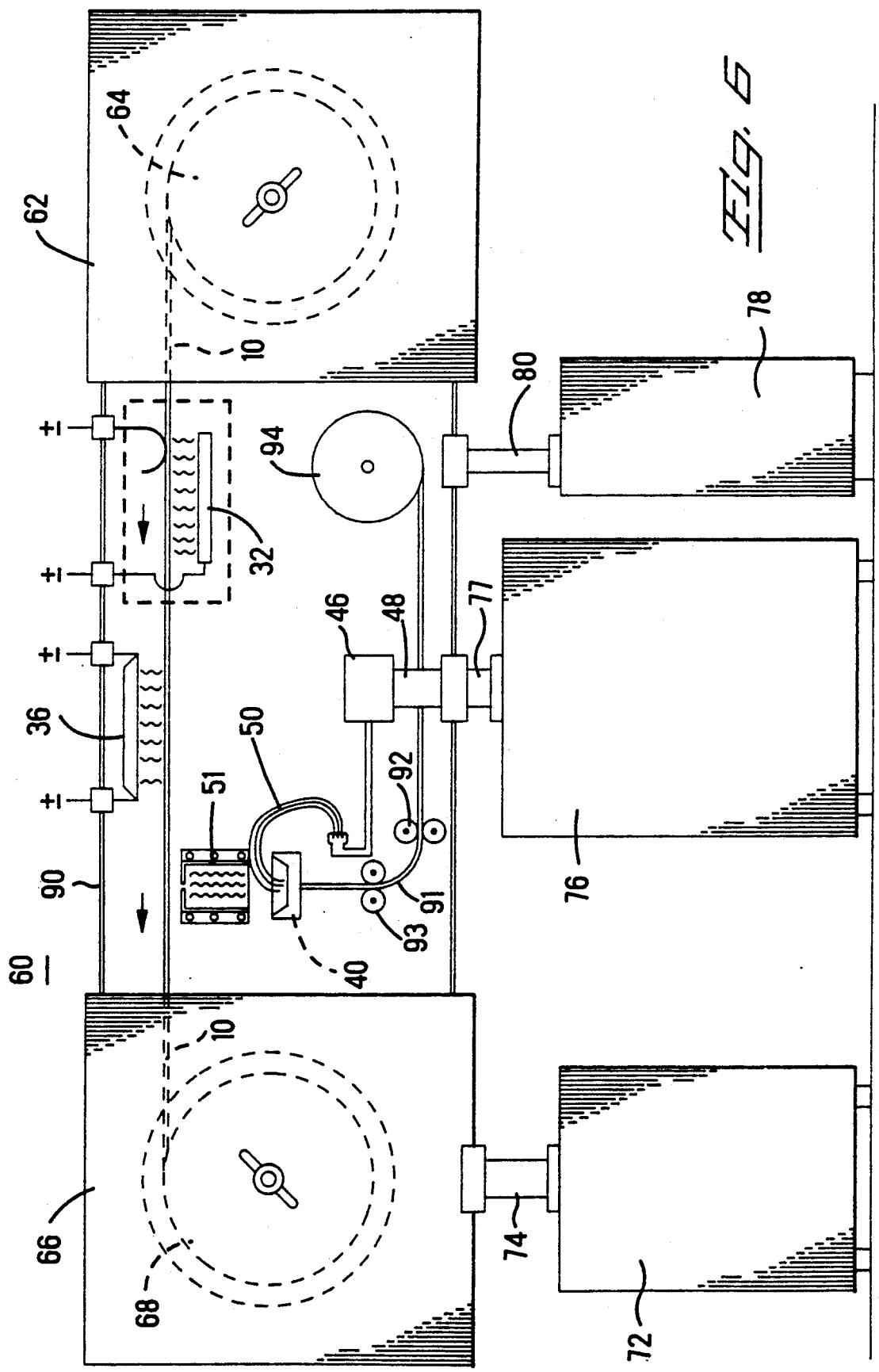
FIG. 6 is a schematic view of the apparatus of the invention in one embodiment showing the general arrangement of supply and takeup reels, the process and support apparatus for practice of the method of the invention.

From the foregoing the method and the apparatus of the invention in a number of features have been detailed. Turning now to FIG. 6, an apparatus in the form of a coating apparatus 60 is shown to include a chamber 62 carrying a reel 64 of strip 10 passing through a process chamber 90 into a takeup chamber 66 containing a takeup reel 68. Reel 68 is powered by means (not shown) to rotate at a desired rate to draw the strip from the supply reel 64 through the processing chamber onto reel 68. In accordance with one embodiment of the invention the chambers 62, 66 and 90 are maintained under vacuum to avoid the need for seals as between the chambers and in particular chamber 90, which must be maintained at a high vacuum. Further in accordance with the invention, the interiors of such chambers are made accessible as by sealed doors for the installation and removal of reels and strip prior to and following processing as is the interior chamber 90. Exterior to the high vacuum area and included as part of the apparatus is a vacuum pump 72 connected to the interior of the high vacuum area by a supply 74. The pump is operable to pull the interior of the three chambers down to the desired vacuum and maintain such during processing.

The E-Beam supply is shown as 76 connected through a coupling 77 to the interior of chamber 90, the E-Beam emitter being shown as 46 connected to 76 via a supply 48. Beam 50 is focused on the crucible 40 as mentioned above. Adjacent to the power supply is a tank 78 containing argon gas connected into the interior of chamber 90 via supply 80. A valve and controls (not shown) meter the argon gas into the interior of 90 to operate in conjunction with the glow discharge ring to produce the plasma scrubbing of strip 10. The glow discharge plasma cleaning region may preferably be separated from the deposition region by vacuum seals, as is mentioned hereinafter and indicated by the phantom lines in FIG. 6. The vacuum pump is accordingly driven by controls (not shown) to maintain the desired vacuum within the chambers Channeling structure 51 is positioned above the crucible 40 as previously described relative to FIG. 3. Additionally included within the chamber 90 is a source of material to be utilized for coating shown in the form of a rod 91 supplied up through the interior of crucible 40 and drawn over and through guide rolls 92 into drive rolls 93 driven by means (not shown) to meter the supply of rod 91 up through crucible 40. Rod 91 is supplied from a supply reel 94 in the manner indicated in FIG. 6. Also not shown but intended to be included where necessary are various detectors to detect the thickness of coating, rate of deposition, and the various temperatures and conditions necessary for effective cleaning, preheat and the like.

The invention contemplates uses with a variety of metal coating materials utilizing apparatus similar to that shown in FIG. 6 scaled up to include the plurality of coating chambers connected between supply and takeup reels in the manner shown in FIG. 7. There an apparatus 100 can be seen in relation to vacuum pump, E-Beam power supply, argon source supply and takeup reels detailed as in FIG. 6, further including chambers 101, 102, and 103 containing suitable components for effecting coatings on a strip 14 and utilizing a common cleaning and preheat station (not shown) contained in chamber 101. Chamber 101 could, for example, effect a coating of nickel with chamber 102 effecting a coating of gold and chamber 103 coating tin or tin lead to provide a product like that shown in FIG. 14 with the several coatings 22, 28, and 26. One design parameter relative to the apparatus 100 pertains to the coating rates, the rates which can be achieved relative to the transport rate of the strip 14. In certain instances it should be understood that the maximum coating rates are sufficiently different to make an apparatus containing more than one coating step impractical. There the slowest coating process may very well be done in a plurality of machines the output of which is subsequently fed to the apparatus which coat faster. The invention contemplates that as an alternative to maintaining high vacuum throughout the plurality of chambers seals may be employed as between the chambers with only partial vacuums maintained in the chambers, the principal low vacuum being maintained only in the vicinity of E-Beam coating. So too with respect to the use of argon wherein it is contemplated that the glow discharge scrubbing step may be separately contained in an argon atmosphere and passed through seals into the high vacuum area, all to minimize the need for vacuum volume.

Thus, the invention contemplates having the various reel supply and takeup as well as most supply outside the vacuum necessary for E-Beam evaporation, or the argon scrubbing stage and using seals to isolate the evaporation and cleaning areas.

The rating of the E-Beam machine, gun and power supply, along with the characteristics of magnetic deflection and beam focus will vary dependent upon the coating application, the choice of coating materials, and the speed with which coating is done. In a model apparatus for processing the invention the E-Beam machine employed had a rating of 14 kw and was supplied by the Industrial Vacuum Engineering Company, of 207 North Amphlett Boulevard, San Mateo, California. The glow discharge ring was spaced from the strip a distance of two inches. The glow discharge power supply included a supply capable of producing up to 5000 volts DC supply to produce the plasma. The plasma produced had an energy of 1-2 Kev. A radiant energy source 36 was comprised of quartz heaters. One embodiment of a channeling structure 51 was comprised of tungsten sheet material on the order of 0.010 inches in thickness formed into a boxlike structure having dimensions on the order of 2 inches by 4 inches by 3 inches. The slit 56 had dimensions of 1 inch by 2 inches. The structure 51 was spaced from the strip 14 approximately 0.750 inches. It was positioned above and spaced from the crucible by a distance of 0.0625 inches and the evaporant transport distance was on the order of 5 inches with respect to strip 14. The channeling structure 51 was supplied by a power supply of 260 amps at 10 volts and heated to a white hot condition on the order of 1600 degrees Celsius. The crucible was approximately 3.5 inches in diameter in dimension and was manufactured by Industrial Vacuum Engineering Company.

The invention contemplates a variety of alternatives for preheating the strip such as using the E-beam formed to scan the strip prior to coating.

Having now described the invention method and apparatus in terms intended to enable those skilled in the art to practice the invention, we set forth what is deemed to be inventive in the appended claims.

We claim:

1. A method of coating metallic articles utilizing an essentially dry process which comprises the steps of:
   a. cleaning a selected area of an article by abrasion to remove macro particles, scales and the like,
   b. exposing said area to a plasma of above a 1–2 Key energy level in the presence of an argon environment,
   c. preheating said area to a temperature above 230 degrees Celsius,
   d. producing an evaporant of a metal to be coated upon said area by evaporation through bombardment by an electron beam directed against the said metal in a vacuum on the order of greater than $10^{-4}$ Torr,
   e. transporting said article in said area within said evaporant at a distance on the order of between 1 and 7 inches whereby said evaporant condenses on the said area to coat said area,
   f. adjusting the rate of transport to effect the thickness of said coating as desired.

2. The method of claim 1 characterized in that the step of producing an evaporant further includes channeling said evaporant to limit exposure to said area or parts of the said area.

3. The method of claim 2 wherein said step of channeling includes the provision of additional step of heating the means of channeling.

4. The method of claim 1 wherein there is further included a series of coating steps incorporating said steps as recited in order providing a first barrier coating followed by a second finish coating of different materials.

5. The method of claim 1 wherein the said step of coating the said material is followed by a second step of coating a different material over said first material by a separate second step of evaporation.

6. The method of claim 1 when said material of said coating is chosen from the materials of gold, nickel, tin, tin lead, copper, zinc, palladium, silver, ruthenium, platinum and alloys thereof.

7. The method of claim 1 wherein the said step of producing an evaporant includes the step of causing said E-Beam to scan the said material whereby to control the characteristics of evaporation.

8. The method of claim 1 characterized in that there is the additional step of controlling the movement of the said article and area to adjust the thickness of coating thereof.

9. The method of claim 1, wherein there is included the further step of supplying said article in the form of a strip and moving said strip through said various method steps.

10. The method of claim 1 wherein there is further included the step of providing a plurality of steps in producing a variety of evaporants from a variety of metals to be coated upon a plurality of areas of said article.

* * * * *

UNITED STATES PATENT OFFICE
CERTIFICATE OF CORRECTION

Patent No. 5,032,421  Dated July 16, 1991

Inventor(s) Srinivasan V. Sarma et al.

It is certified that error appears in the above-identified patent and that said Letters Patent is hereby corrected as shown below:

In the Claims:

Claim 1, line 15, column 7 - delete the word "Key" and replace with
--Kev--.

In the Abstract:

line 1 - delete the word "a" and insert --an apparatus (60) and--.

Signed and Sealed this

Fifteenth Day of December, 1992

Attest:

DOUGLAS B. COMER

Attesting Officer  Acting Commissioner of Patents and Trademarks